United States Patent
Maeda

(10) Patent No.: US 6,818,861 B2
(45) Date of Patent: Nov. 16, 2004

(54) DISCHARGE ELECTRODE FOR A WIRE BONDING APPARATUS

(75) Inventor: Toru Maeda, Tachikawa (JP)

(73) Assignee: Kabushiki Kaisha Shinkawa, Tokyo (JP)

(*) Notice: Subject to any disclaimer, the term of this patent is extended or adjusted under 35 U.S.C. 154(b) by 0 days.

(21) Appl. No.: 10/671,089

(22) Filed: Sep. 25, 2003

(65) Prior Publication Data

US 2004/0060915 A1 Apr. 1, 2004

(30) Foreign Application Priority Data

Sep. 27, 2002 (JP) ........................................ 2002-282935

(51) Int. Cl.$^7$ ............................................. B23K 31/00
(52) U.S. Cl. .............................. 219/145.21; 219/56.21; 219/146.21
(58) Field of Search ....................... 219/145.21, 146.21, 219/75, 56.21, 56.22

(56) References Cited

U.S. PATENT DOCUMENTS 5,616,257 A * 4/1997 Harada et al. ........... 219/56.21
5,649,355 A * 7/1997 Offer ............................ 29/825

FOREIGN PATENT DOCUMENTS

JP S61-279140 12/1986
JP H4-263442 9/1992

OTHER PUBLICATIONS

Kataoka et al., "Insulating Property of Plasma Sprayed Alumina Coatings Sealed by Laser PVD Film", posted in 1994 on the Internet web page of Aichi Industrial Technology Institute.

* cited by examiner

Primary Examiner—Clifford C. Shaw
(74) Attorney, Agent, or Firm—Koda & Androlia

(57) ABSTRACT

A straight rod form discharge electrode used in a wire bonding apparatus. The electrode core material is covered, except for its tip end, by an alumina film that has been subjected to a pore sealing treatment. The alumina film subjected to the pore sealing treatment is formed by a two-stage process. In the first-stage, an alumina film having a porous structure is formed on the surface of the electrode core material for the thickness of approximately 6 $\mu$m by plasma flame coating method or anodic oxidation method; and in the second-stage, the porous structure is subjected to a pore sealing treatment in which an alumina film is caused to adhere to the porous structure by laser PVD or a pore sealing treatment is performed with a resin.

5 Claims, 3 Drawing Sheets

DISCHARGE ELECTRODE FOR A WIRE BONDING APPARATUS

BACKGROUND OF THE INVENTION

1. Field of the Invention

The present invention relates to a discharge electrode for a wire bonding apparatus and more particularly to a discharge electrode for a wire bonding apparatus that has an insulating film on the surface of the electrode.

2. Prior Art

In a wire bonding apparatus, for instance, bonding pads formed on a die such as an LSI (large-scale integrated circuit), etc. and bonding leads of a circuit board are connected by, for example, a fine gold wire. At initial bonding in such a gold wire to a bonding pad, the tip end of the gold wire that passes through a capillary is formed into a ball shape. The ball-shaped entity that is formed on the tip end of this gold wire is called an initial ball.

FIG. 4 shows how the initial ball is formed in a conventional technique.

The tip end of a discharge electrode 10 is bent, and this discharge electrode 10 is set in a position that faces the tip end of a wire 14 that passes through a capillary 12. When a high voltage in which the discharge electrode side is placed at a negative polarity is applied across the discharge electrode 10 and wire 14 by a high voltage generator 16, a space discharge occurs between the facing tip end of the discharge electrode 10 and the wire 14, so that the tip end of the wire 14 is melted, thus forming an initial ball. In this way, the initial ball is formed by a discharge 18 that occurs between the discharge electrode 10 and the tip end of the wire 14.

In order to obtain a stable discharge and form a stabilized initial ball shape by limiting the location of the discharge on the discharge electrode, the surfaces of the discharge electrode other than the discharge surface are typically covered by an insulating film. Various types of films such as tetrafluoroethylene films, alumina coating films, fluororesin coating films, silicon oxide or alumina oxide are used as insulating films as disclosed in, for instance, Japanese Patent Application Laid-Open (Kokai) Nos. S61-279140 and H4-263442. A stable discharge is also obtained by bending the discharge electrode as shown in FIG. 4 (and as disclosed in Japanese Patent Application Laid-Open (Kokai) No H4-263442), thus making a clear difference in the discharge distance.

The reason that various types of films are used as coating films for discharge electrodes as described above is that the insulating films have respective advantages and disadvantages in terms of heat resistance, insulating properties and coverage of indentations and projections in the external shape of the discharge electrode, etc. For example, in the case of resin films, there are difficulties in terms of durability, depending on the material, gases may be generated by the high heat during discharge, thus clouding the optical system of the wire bonding apparatus or causing a deterioration in the elements that make up the system, such as solidification of the gases and adhesion to the bonding head, etc.

Furthermore, alumina films have stable physical properties and chemical properties, and they are considered as insulating films that have good compatibility with discharge electrodes that generate a high heat during discharge. However, while such films have a sufficient electrical resistance in terms of contact resistance, these films have a low resistance with respect to discharges because of their porous structure. In other words, such films suffer from the following drawback: a discharge occurs at a low voltage from thin portions of the film that has a porous structure, and when a continuous discharge occurs, the surrounding film is destroyed.

A number of techniques for sealing the pores of porous structures (centering on film formation techniques) are known. However, all of these techniques concentrate on characteristic evaluation as insulating films, with no mention of resistance to discharges, etc. For example, in one of the reports of the Aichi Industrial Technology Institute written by Kataoka et al. under the title of "Insulating Property of Plasma Sprayed Alumina Coatings Sealed by Laser PVD Film" and posted in 1994 on the Internet web page of Aichi Industrial Technology Institute, sprayed coating films were covered by a PVD (physical vapor deposition) film, and the insulating resistance was evaluated; however, no evaluation regarding resistance to discharges was indicated in this report.

Conventional techniques thus have problems involving generation of undesirable gases in the coating film of the discharge electrode by the discharge or a low resistance to discharges, etc. Accordingly, the ability to withstand a discharge is insufficient, a stable discharge cannot be ensured, and a stabilized shape for the initial ball likewise cannot be ensured.

In the methods that limit the location of discharge by way of bending the tip end of the discharge electrode in order to cover for an insufficient ability to withstand a discharge, it is necessary to raise the capillary by an excess amount that corresponds to the amount of bending in order to form an initial ball by a discharge. As a result, the wire bonding treatment speed drops, and there are restrictions on the range of mobility of the area around the bonding head, including the capillary.

SUMMARY OF THE INVENTION

Accordingly, the present invention solves the above-described problems encountered in the prior art.

It is an object of the present invention to provide a discharge electrode for a wire bonding apparatus that can ensure a stable discharge.

It is another object of the present invention to provide a discharge electrode for a wire bonding apparatus that can improve the resistance with respect to discharges.

The above object is accomplished by a unique structure of the present invention for a discharge electrode used in a wire bonding apparatus that applies a high voltage across an electrode and a tip end of a wire bonding wire so that a discharge is generated between the electrode and the wire; and in the present invention, the discharge electrode is comprised of:

a conductive electrode core material; and an insulating film that has a porous structure and is formed on the surface of the electrode core material, the insulating film being formed with an insulating layer which is obtained by having the porous structure subjected to a pore sealing and which covers the electrode core, and the electrode having, on a portion of its discharge position that faces the tip end of the wire, an exposed surface where the electrode core material is exposed.

In the structure above, the electrode core material is covered by an insulating film in which the pores of its porous structure are sealed, except in the area of the discharge position that faces the tip end of the wire. The insulating film that has a porous structure has a low resistance with respect to discharges; however, since in the present invention the porous structure is subjected to a pore sealing treatment, the resistance with respect to discharges improves. Accordingly, a discharge is generated only on the exposed surface of the discharge position, so that a stable discharge is ensured.

In the above discharge electrode, it is preferable that the insulating film that has the porous structure is a porous alumina film that is formed by an anodic oxidation method or a plasma flame coating method. In addition, the insulating layer formed by the pore sealing treatment is preferably an insulating layer that is formed by depositing an inorganic material film on the surface of the porous alumina film by laser PVD. Since the pores of the alumina film that has a porous structure are sealed by the inorganic material film, the alumina film, which has stable physical characteristics and chemical characteristics and which has good compatibility with a discharge electrode that generates a high heat during discharge, is used in the present invention as an insulating film of the discharge electrode.

Furthermore, the insulating layer formed by the pore sealing treatment is an insulating layer formed by impregnating the porous alumina film with a resin. The pores of the alumina film that has a porous structure are thus sealed by resins in the present invention, and a material that shows little out-gassing is preferably employed as the resin that embeds the porous structure.

DETAILED DESCRIPTION OF THE INVENTION

Figure 4:
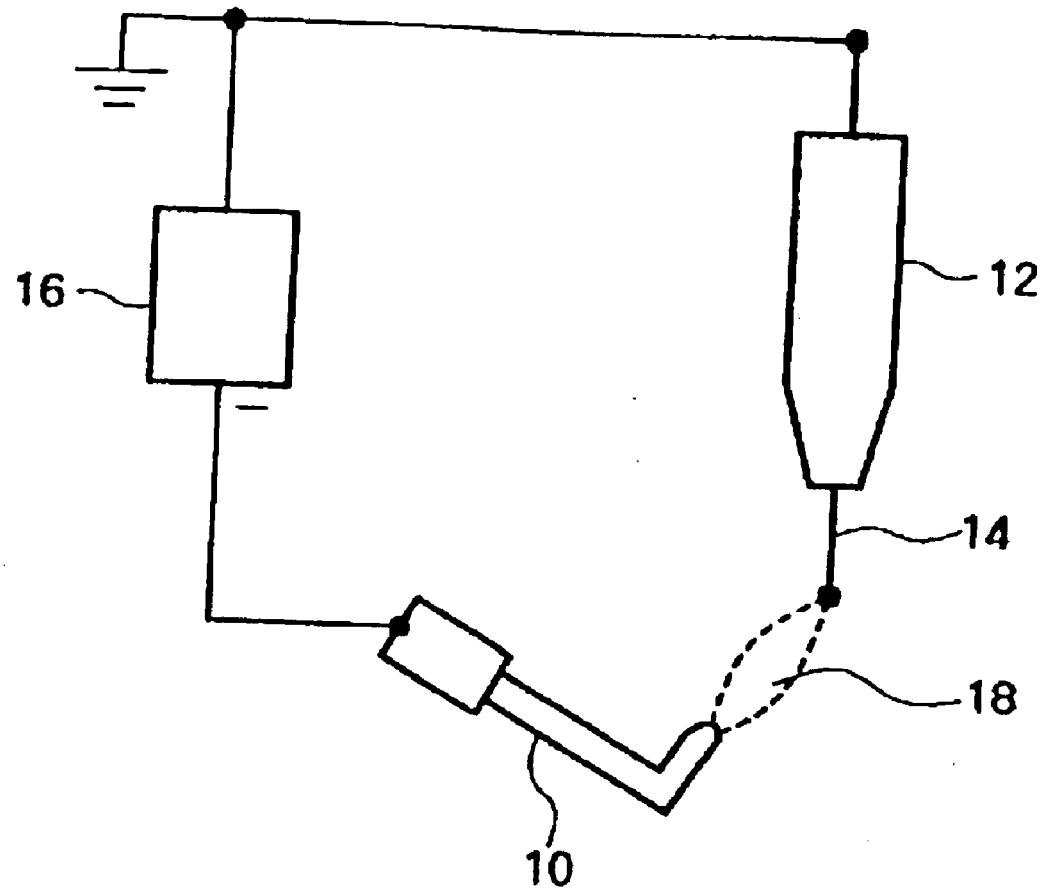
FIG. 4 is a diagram showing the manner of forming the initial ball in prior art technique.

Embodiments of the present invention will be described in detail below with reference to the accompanying drawings. In the following description, elements that are the same as those in FIG. 4 will be labeled with the same reference numerals.

Figure 1:
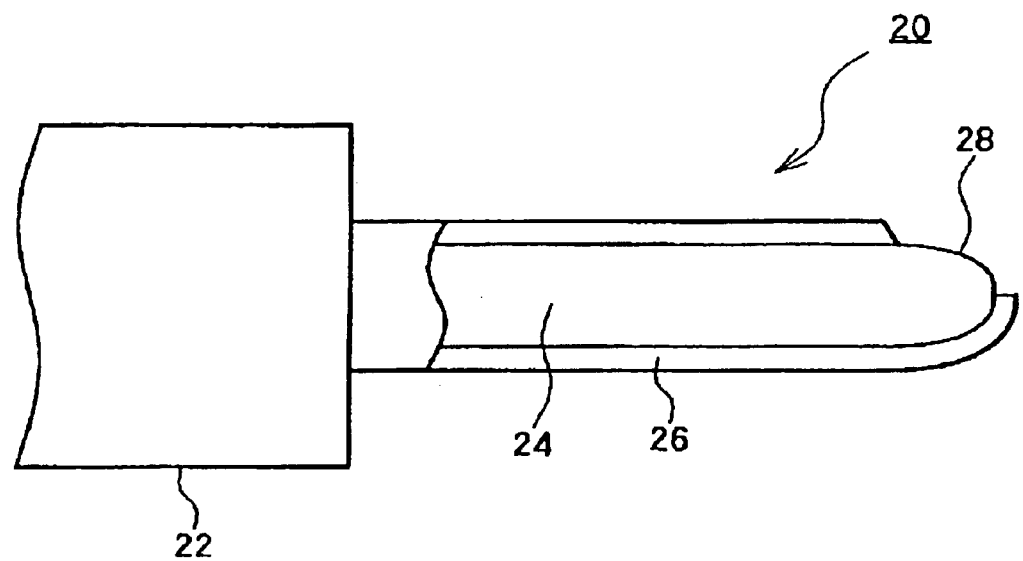
FIG. 1 is a diagram showing the discharge electrode according to one embodiment of the present invention, the electrode being attached to a holder and shown in partially cross section.

In FIG. 1, the discharge electrode 20 of one embodiment of the present invention is attached to a holder 22. The discharge electrode 20 is shown in partial cross section. The discharge electrode 20 has a straight rod shape, and its tip end is rounded in a hemispherical shape. The surface of the electrode core material 24 is covered by an alumina film 26 that has been subjected to a pore sealing treatment, and an exposed surface 28 where the electrode core material 24 is exposed is formed on the tip end of the discharge electrode 20 in a position that is offset from the central axis of the straight discharge electrode. A round rod consisting of a conductive metal, e.g., a Pt material with a diameter of approximately 0.6 mm, can be used as the electrode core material 24. The thickness of the alumina film that is subjected to the pore sealing treatment, is for instance, 5 to 7 $\mu$m.

The alumina film 26 that is subjected to a pore sealing treatment can be formed by a process that is roughly separated in two stages. In the first-stage process, an alumina film that has a porous structure is formed on the surface of the electrode core material 24; and in the second-stage process, the porous structure is subjected to a pore sealing treatment.

In these processes, it is desirable that the portion of the discharge electrode 20 that is attached to the holder 22 be masked, so that neither an alumina film that has a porous structure nor a film formed by the pore sealing treatment is formed on such a portion that is attached to the holder 22. It is indeed possible to form the films over the entire surface of the discharge electrode 20 and then to remove the films that exist in the portion that is attached to the holder.

In the first-stage process in which the alumina film having a porous structure is formed, an alumina film with a thickness of approximately 6 $\mu$m is formed by plasma flame coating method on, for example, a Pt material that is approximately 0.6 mm in diameter. Instead of plasma flame coating method, it is also possible to form the alumina film with a thickness of approximately 6 $\mu$m on the surface of the electrode core material by anodic oxidation method.

In the second-stage process which is a pore sealing process, if the pores are sealed by an inorganic material, then an alumina film is caused to adhere to the surface of the alumina film having a porous structure by means of a laser PVD process. In this film formation, the adhering alumina film is caused to enter the interiors of the pores of the porous structure by controlling the amount of heat applied to the target by irradiation with the laser.

In cases where the pore sealing treatment is performed with a resin, then the discharge electrode that has an alumina film having a porous structure is coated with or immersed in, for instance, an epoxy resin and is impregnated with the resin under reduced pressure. An acrylic resin or silicone resin may also be used instead of an epoxy resin.

Figure 2:
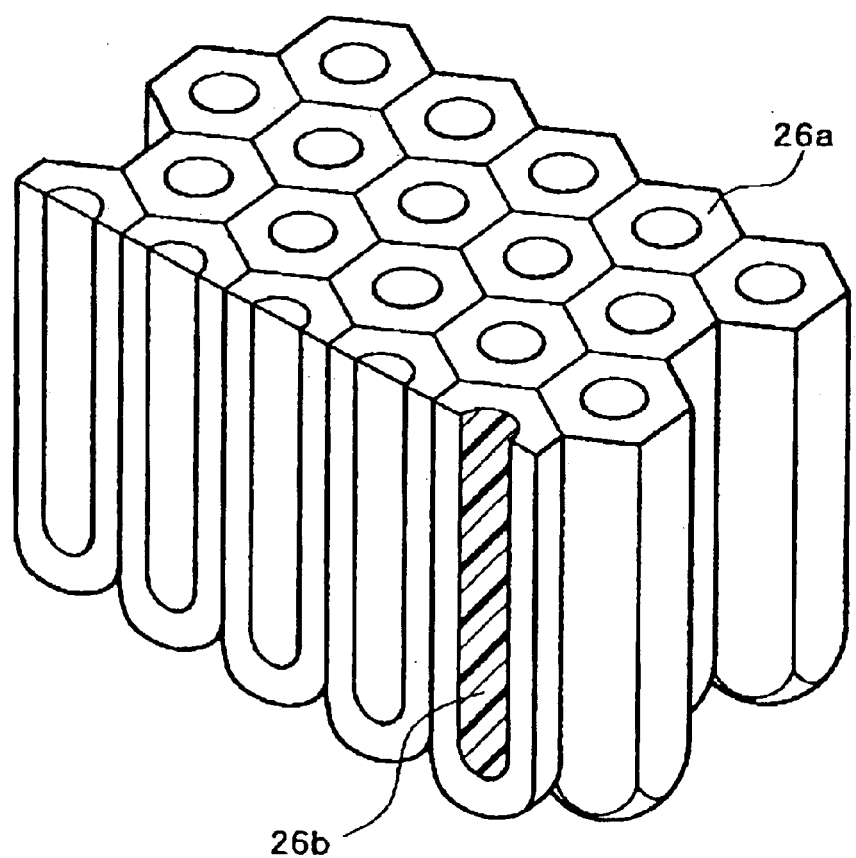
FIG. 2 is diagram of the alumina film that has a porous structure according to one embodiment of the present invention, the pores of the alumina film being impregnated with a resin.

FIG. 2 shows a model showing how the pores of an alumina film 26a having a porous structure formed by the anodic oxidation method are impregnated with a resin 26b. When an insulating film that has a porous structure and an impregnation with a resin are thus used in combination, the insulating performance that is sufficient to withstand the discharge can be obtained using an amount of resin that is sufficient to embed the gas bubble portions of the porous structure. Accordingly, the pore sealing treatment can be performed with a relatively small amount of resin compared to cases where the entire surface of the electrode core material is coated with a resin; and for example out-gassing can be greatly reduced, and selection range of usable resins can be expanded, compared to insulation film formation methods using conventional resin coating.

After the alumina film subjected to the pore sealing treatment has thus been formed on the surface of the electrode core material, an exposed surface 28 where the electrode core material 24 is exposed is formed on the tip end of the straight rod shape electrode core material. This is done by using a tool to remove the alumina film subjected to the pore sealing treatment from the area of a position that is offset from the central axis of the straight electrode core material. The reason that the exposed surface 28 is offset from the central axis of the straight electrode core material is to limit the direction of the discharge to a direction that faces the tip end of the wire that is on the other side of the discharge.

The tool that is used to form the exposed surface 28 on the tip end of the discharge electrode 20 can be a special scraping tool or file, etc. Furthermore, it is also possible to mask or cover the portion that corresponds to the desired exposed surface in the porous alumina film formation process and pore sealing treatment process, so that an alumina film subjected to the pore sealing treatment does not adhere to this portion. Alternatively, a desired portion of the alumina film subjected to a pore sealing process can be removed by lift-off, etc. using a resist as the mask or cover. Moreover, it is also possible to remove the alumina film upon which the pore sealing treatment has been done by way of subjecting the electrode core material to a forcible discharge from a close distance in the desired position of the exposed surface.

Next, the evaluation of the discharge resistance of a discharge electrode, which has an alumina film subjected to a pore sealing treatment on the surface of the electrode core material and which has an exposed surface on the tip end, will be described.

The discharge resistance of such a discharge electrode is evaluated from the standpoint of whether or not undesirable gases are generated by the high heat created by the discharge, and whether or not a discharge is generated from portions other than the exposed surface, i.e., portions that are covered by an insulating layer, by the high discharge voltage when a high discharge voltage is applied across the discharge electrode and wire. For example, in regard to resins, general out-gassing standards have been established; however, these standards are not always established from the standpoint of whether or not elements of the wire bonding apparatus, e.g., lenses, are clouded by such out-gassing. Furthermore, in regard to the insulating properties of insulating films, as described above, the insulating properties are generally evaluated in terms of so-called contact resistance; an evaluation in terms of resistance with respect to discharges is not performed. Accordingly, in regard to discharge electrodes, it is necessary to evaluate the ability to withstand a discharge in the actual discharge environment.

Figure 3:
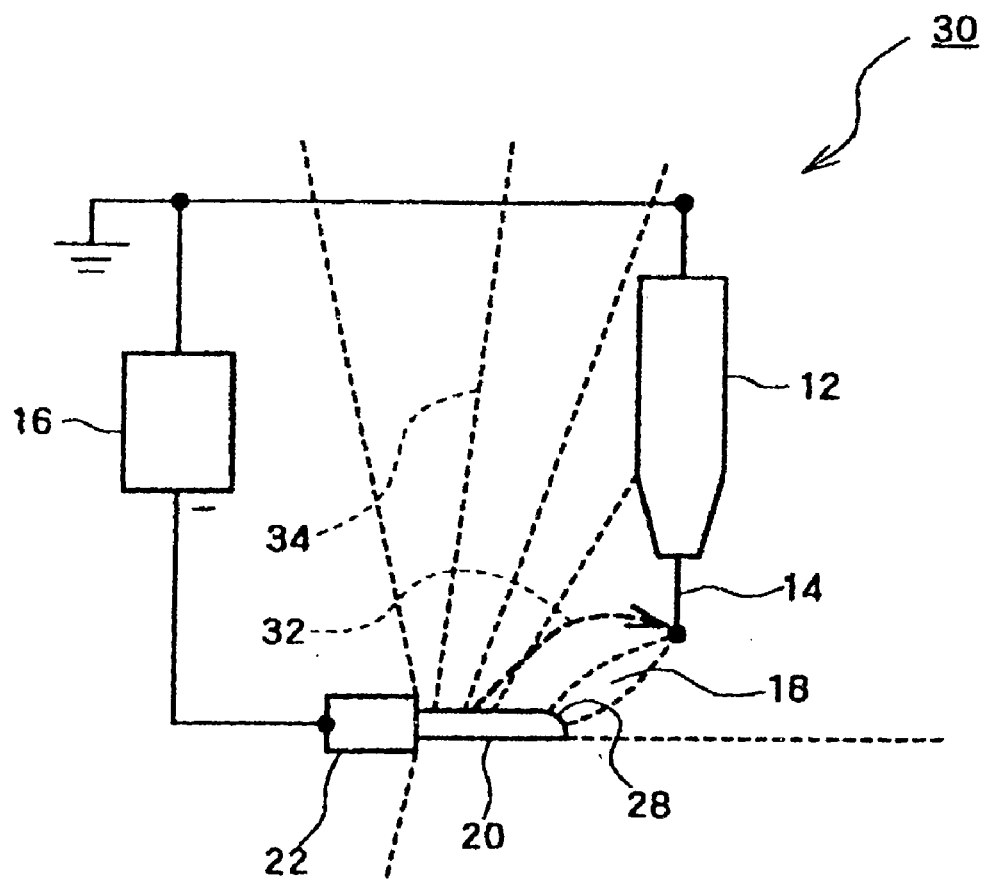
FIG. 3 is a diagram that illustrates how the discharge resistance is evaluated for the discharge electrode of the embodiment of the present invention, the discharge electrode being attached to a holder of a wire bonding apparatus.

FIG. 3 is a diagram that shows how the discharge resistance is evaluated on the discharge electrode 20 attached to a holder 22 of a wire bonding apparatus 30. The discharge electrode 20 is connected to the negative polarity side of a high voltage generator 16 via the holder 22, and the wire 14 is connected to the ground side of the high voltage generator 16. The distance between the exposes surface 28 on the tip end of the discharge electrode 20 and the tip end of the wire is set at, for instance, 10 mm.

In this state, a high voltage of, for instance, −2400 to −3000 V is applied across the discharge electrode 20 and wire 14 by means of the high voltage generator 16 for a specified period of time, so that a discharge is generated. Afterward, the discharge electrode 20 is removed, and the external appearance of the electrode is observed. In cases where an external discharge 32 is generated from other surfaces of the discharge electrode 20, black discharge scars, for instance, are observed on these surfaces. In particular, if a continuous discharge occurs locally, discharge scares can be conspicuously detected.

The resistance of an alumina film subjected to a pore sealing treatment with respect to discharges can be evaluated as described above. In cases where an alumina film used for pore sealing is caused to adhere to the porous structure by means of, for instance, laser PVD, the pore sealing properties can be controlled by the amount of heat that is applied to the target by irradiation with the laser, etc. Accordingly, manufacturing method conditions which satisfy the requirements for the desired resistance performance with respect to the discharge can be selected by establishing a correspondence between the pore sealing control parameters and the resistance with respect to a discharge.

Furthermore, in cases where a pore sealing treatment is performed using a resin, out-gassing 34 from the discharge electrode 20 is evaluated. After a high voltage has been applied for a specified period of time as describe above, the surfaces of the optical parts of the wire bonding apparatus, such as lenses, etc. are inspected for clouding. Furthermore, an inspection is made for the adhesion of crystallized components caused by out-gassing on the surfaces of the bonding head such as the capillary 12, etc. in close proximity to the discharge electrode 20. In this case, an accelerated test using a continuous discharge 18, etc. can also be performed.

In this way, the effects of out-gassing caused by the high heat during the discharge can be evaluated. Since the occurrence of out-gassing depends on the components of the impregnating resin, resins which show little out-gassing having an effect on elements of the wire bonding apparatus can be selected by establishing a correspondence between resin components and evaluation of the effects of out-gassing.

In the above description, a round rod is used as the electrode core material. However, this material may have some other cross-sectional shape, such as an elliptical or rectangular cross-sectional shape, etc. Likewise, the cross-sectional size is not limited to a diameter of 0.6 mm. Furthermore, though a simple straight core material is used in the above embodiment as the electrode core material, the present invention is applicable to a bent core material. Moreover, though an alumina film is used as the film that has a porous structure, it is possible in the present invention to use a porous film consisting of some other material, e.g., an anodically oxidized film of some other material, etc. In addition, the film thickness is not limited to 5 to 7 $\mu$m.

In addition, in regard to the pore sealing treatment, the deposition of alumina as an inorganic material and impregnation with a resin are described in the above. However, it is possible in the present invention to use a method in which pore sealing is accomplished by modifying the surface of the porous material. For example, a steam pore sealing treatment that uses a hydration reaction with the porous material that is accomplished using pressurized steam at a pressure of 0.3 to 0.6 atm, or a boiling water pore sealing treatment utilizing a hydration reaction with the porous material that is accomplished by immersing the porous structure in boiling water can be employed. Furthermore, additives such as organic compounds or inorganic compounds, etc. can be added to the pore sealing solutions. For example, nickel salts of acetic acid, boric acid, potassium bichromate, sodium bichromate, etc. can be used as such additives. In the case of such pore sealing treatments accomplished by modification methods as well, manufacturing method conditions that satisfy the requirements for the desired discharge resistance can be selected by way of establishing a correspondence with the above-described discharge resistance evaluation.

As seen from the above, according to the discharge electrode of the present invention, a stable discharge is ensured in a wire bonding apparatus.

What is claimed is:

1. A discharge electrode for a wire bonding apparatus which applies a high voltage across an electrode and a tip end of a wire bonding wire so that a discharge is generated between said electrode and said wire, said discharge electrode comprising:

a conductive electrode core material; and an insulating film that has a porous structure and formed on a surface of said electrode core material, said insulating film being formed with an insulating layer which is obtained by having said porous structure subjected to a pore sealing treatment and covers said electrode core, and said electrode having, on a portion of a discharge position thereof that faces a tip end of said wire, an exposed surface where said electrode core material is exposed.

2. The discharge electrode according to claim 1, wherein said insulating film having said porous structure is a porous alumina film formed by an anodic oxidation method.

3. The discharge electrode according to claim 1, wherein said insulating film having said porous structure is a porous alumina film formed by a plasma flame coating method.

4. The discharge electrode according to claim 2 or 3, wherein said insulating layer formed by said pore sealing treatment is an insulating layer which is formed by depositing an inorganic material film on a surface of said porous alumina film by laser PVD.

5. The discharge electrode according to claim 2 or 3, wherein said insulating layer formed by said pore sealing treatment is an insulating layer formed by impregnating said porous alumina film with a resin.

* * * * *